United States Patent

Gutmann et al.

Patent Number: 6,070,130
Date of Patent: May 30, 2000

[54] METHOD FOR TESTING A LARGE QUANTITY OF PRODUCTS

[75] Inventors: Ralf Gutmann, Jagsthausen; Rolf Jäger, Talheim, both of Germany

[73] Assignee: Temic Telefunken Microelectronic GmbH, Heilbronn, Germany

[21] Appl. No.: 08/908,428

[22] Filed: Aug. 7, 1997

[30] Foreign Application Priority Data

Aug. 10, 1996 [DE] Germany .............................. 196 32 364

[51] Int. Cl.$^7$ ................................................. G01R 31/01
[52] U.S. Cl. ............................................ 702/81; 702/84
[58] Field of Search ..................... 702/35, 81–84

[56] References Cited

U.S. PATENT DOCUMENTS

| | | | |
|---|---|---|---|
| 4,875,002 | 10/1989 | Sakamoto et al. | 324/73.1 |
| 5,539,752 | 7/1996 | Berezin et al. | 364/490 |
| 5,793,650 | 8/1998 | Mirza | 702/34 |

OTHER PUBLICATIONS

Robert J. Feugate: "Introduction to VLSI Testing"; Prentice Hall, 1988, pp. 14–97.

Linda Milor et al.: "Minimizing Production Test Time to Detect Faults in Analog Circuits". In: IEEE Transactions, vol. 13, No. 6, Jun. 1994, pp. 796–813.

"CAQ–Systeme" by A. Schloske. Microtecnik Nr. 1,1, of Jan. 1993, pp. 26–29.

"Die Best Teststrategie Heraufinden Programm Auf PC–Basis Verhilft Zur Optimierung" by K. Jeschke et al. Bd.42,Nr. 23, 16. Nov. 1993, pp. 52–55.

"Dynamisierte Wareneingangspruefung Elektronischer Komponenten" by I. Heisecke. Bd.111,Nr.14,1.Jul. 1990 pp. 730,732, 733–735.

"On Optimising VLSI Testing or Product Quality Using Die–Yield Prediction" by A.D.Singh et al. IEEE Transacctions, Bd12, Nr.5,1. May 1993, pp.695–709.

"Messtechnik und Ruckverfolgbarkeit in der Qualitatssicherung" by N.M.Durakbasa. Electrotechnik und Informationstechnik, Bd.111, Nr.4,1.Jan. 1994,pp 185–6.

*Primary Examiner*—Marc S. Hoff
*Assistant Examiner*—Craig Steven Miller
*Attorney, Agent, or Firm*—Venable; George Spencer; Norman Kunitz

[57] ABSTRACT

A method of testing a large number of products in which every product to be tested is subjected to at least one test mode that is carried out in a test sequence successively on all products by means of a test operation comprising several successively performed measurement operations, where statistical information on the test operation of products already tested is allowed for and where a test result is allocated for every product tested. In every test mode the order of the measurement operations of a test operation is specified such that the measurement operations are arranged in accordance with their fault frequency per measurement time and the functional dependencies between the measurement operations. Every test operation within the test sequence of a test mode is allocated a measurement mode which has a certain quantity of measurement operations to be performed and which is specified in accordance with the quantity and the products already tested in a test sequence.

14 Claims, 1 Drawing Sheet

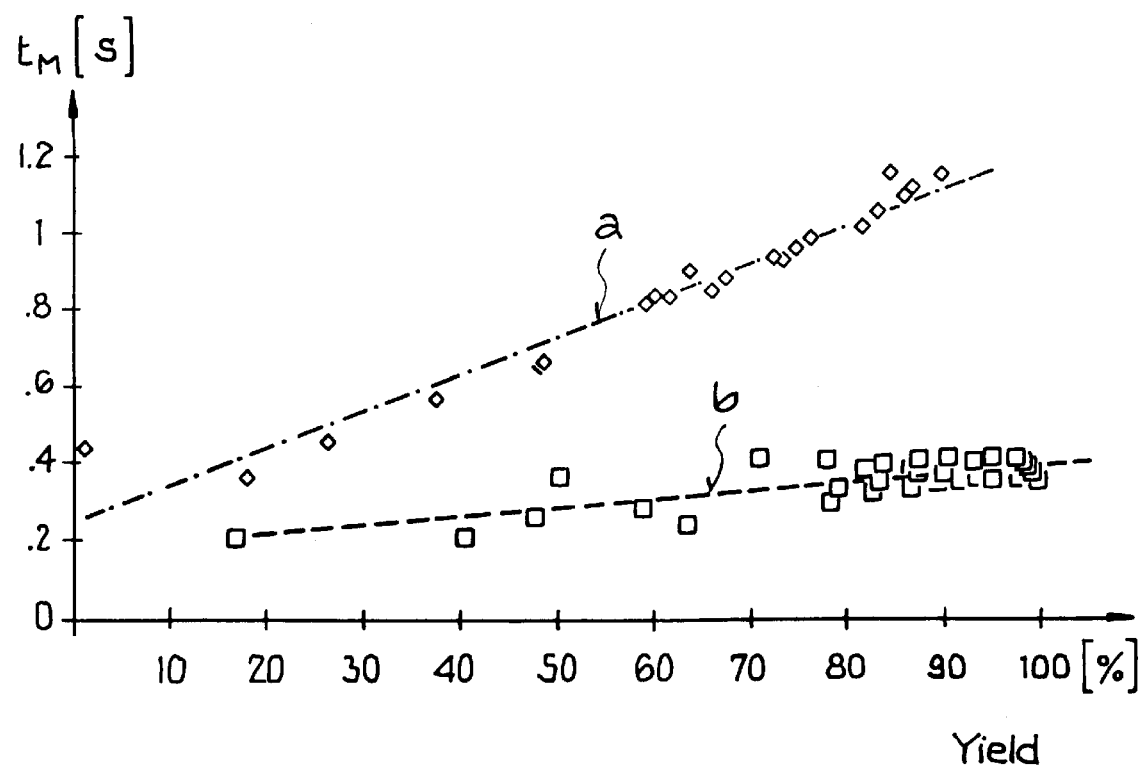
FIG.

METHOD FOR TESTING A LARGE QUANTITY OF PRODUCTS

BACKGROUND OF THE INVENTION

All complex products and all products made by a complex manufacturing process should or must before use be subjected to a test by the manufacturer and/or the user, for example a function test or a parameter test. This is important in particular for semiconductor components because on the one hand these are manufactured in large quantities and on the other they are often used in safety-relevant areas of application (for example, integrated circuits in motor vehicles for ABS, airbag, ignition modules). The testing of these products, for example, the specific properties to be verified, is generally integrated by the manufacturer in the manufacturing process and performed in at least one test mode at the beginning of the manufacturing process and/or during the manufacturing process and/or on completion of the manufacturing process in a testing sequence with successive test operations for a large number of products. Usually at least one test mode is performed at the beginning of or during the manufacturing process of the products and one test mode at the end of the manufacturing process (after completion) of the products. For example, in the manufacturing process of semiconductor elements, it is usual for a test mode to be carried out on the semiconductor elements on the semiconductor wafer as so-called "samples" and a test mode to be carried out on the finally assembled and mounted semiconductor components as so-called "final measurement".

Every test operation in a test mode covers the determination of a large number of parameters characteristic for the properties of the product to be tested (for example mechanical, electrical or optical parameters) which are determined in sequential (i.e. successive) measuring operations (sometimes more than 1000 measuring operations are required for each test operation), and where the individual measuring operations of a test operation are usually performed on a computer-controlled automatic testing machine. Because of the scatter in the manufacturing process (process steps with a high degree of scatter) and the frequently high quality requirements, the products to be tested should be subjected to a 100% test. This 100% test, however, necessitates that all measuring operations in a test operation be performed, and this involves high costs (especially when there are several test modes in a manufacturing process). In some cases, the cost of testing a product must be assumed to be one-half of the manufacturing cost.

In the literature reference Milor, L., Sangiovanni-Vintentelli, A. L., "Minimizing Production Test Time to Detect Faults in Analog Circuits", IEEE Transactions on Computer-Aided Design of Integrated Circuits and Systems, Vol. 13, No. 6, June 1994, pp. 796–813, a method is described for testing products where in a particular test mode, a variation of the sequence of the measuring operations is performed with respect to the duration of a test operation and the selection of a subset of measurement operations from the total of all measurement operations with respect to the quality requirements of the test mode. By means of an algorithm, a subset of measurement operations is determined on the basis of statistical information and the subset selected in such a way that a desired yield can be obtained. It is disadvantageous that the method can be used only when the individual measurement operations of a test operation can be interchanged at will in their sequence (that is, when there is absolutely no dependence between the individual measurement operations) and that the testing of the products within the successive testing sequence of a test mode always takes place with the same subset of measurement operations which results in the loss of statistical information for the measuring operations of a test operation for this test sequence and subsequent test sequences.

OBJECT OF THE INVENTION

The object of the invention is to provide a method for the testing of a large number of products that avoids these disadvantages and which can be applied universally to all products to be tested.

SUMMARY OF THE INVENTION

In accordance with the invention, the above object is solved by a method of testing a large number of products in which every product to be tested is subjected to at least one test mode that is carried out in a test sequence successively on all products by means of a test operation comprising several successively performed measurement operations, where statistical information on the test operation of products already tested is allowed for and where a test result is allocated for every product tested; and wherein:

in each test mode, the order of the measurement operations of a test operation is specified such that the measurement options are arranged under consideration of their error frequency per measurement time and the functional dependencies between the measurement operations; and each test operation within the test sequence of a test mode is allocated a measurement mode which has a certain quantity of measurement operations to be performed and which is specified in accordance with the quantity and the test results of the products already tested in a test sequence.

Advantageous further developments and configurations of the method are described in the Claims.

The method described here generates for each test mode a test sequence with successive test operations making allowance for statistical information relating to previous test operations (for instance, earlier manufacturing processes) with an identical specification of the sequence of the measurement operations for all test operations of the test sequence of a test mode, this specification being given with respect to fault frequency per measurement time and functional dependencies between the measurement operations; in particular, the measurement operations are organized in the order of their fault frequency per measuring time making allowance for the functional dependencies between the measurement operations such that measurement operations with high fault frequency per measurement time are performed at the beginning of a test operation and consequently the potential occurrence of faults is detected at an early stage within a minimum of measurement time, allocation of a measurement mode for every test operation of a product, specified for each product to be tested in accordance with the number of products already tested in a test sequence and the relevant test results, i.e., the test sequence is matched adaptively in every test mode to the test result (and consequently to the fault frequency or fault distribution) for the products in a test sequence. The measurement modes of the various test operations within the successive test sequence of a test mode differ here in the number of measurement operations performed in relation to the total number of measurement operations of a test operation, i.e., not all measurement operations of a test operation are performed for every product to be tested.

The number of measurement operations of a measurement mode and the order of the various measurement modes within the successive test sequence can be preset variously in accordance with specific criteria; for example with respect to a minimization of the manufacturing costs of the product influenced by the function test or with respect to ensuring a guaranteed maximum number of defective products with negative test result (reject rate) or with respect to the avoidance of data losses or statistical information. In particular, the order of the measurement modes is preset as a function of the number of products already tested in a test sequence (that is, as a function of the number of test operations already performed within the test sequence) and of the test result of the products already tested (that is, as a function of the distribution of the products with positive or negative test result within the test sequence). Preferably, one of two different measurement modes is assigned to each test operation of a test mode: either a total measurement mode in which all measurement operations of a test operation are performed, or a partial measurement mode in which a positively fixed subset of the measurement operations of a test operation are performed. The total measurement mode is preset where there is a particular number of successive test operations in the test sequence: at the beginning of the test sequence, after the test operation of a product with negative test result, and after several test operations of products with positive test result—for instance at the beginning of the test sequence with two successive test operations, that is the first two test operations in the test sequence, the first two test operations following the test operation of a product with negative test result, and after the test operation following the test operation of three products with positive test result, i.e. during the test operation of every fourth product.

The method described here combines several advantages:

It is reproducible and substantiated mathematically because the test sequence is controlled on the basis of statistical information without empirical influence or subjective decisions. It can therefore be automated to a large extent without elaborate setting work being necessary.

It is safe because a loss of the statistical information over individual measurement operations or test operations within a test sequence, over the various test sequences of a test mode and over various test modes, and thus over the product behavior in the current production run, is avoided. All parameters of the test operation (measurement time, yield, costs, etc.) of a test mode and their scatter can be determined before the test sequence starts and can be added to or checked during the test operation by the test results of the products already tested so that in every test mode a statistical basis (adjusted automatically and independent of the fault frequency or yield of the products to be tested) is assured for all test operations in the test sequence and automatic adaptation to naturally changing characteristics of the manufacturing process of the products. In addition, this means that the prescribed requirements in terms of the quality of the product are assured over the entire period of production of a particular product or different product types.

Optimization with respect to freely selectable criteria is possible, for example with respect to minimization of the manufacturing costs or the measurement times for a specified quality of product.

BRIEF DESCRIPTION OF THE DRAWINGS

The FIGURE is a graph of measured time versus yield for a conventional method and for the method according to the invention.

DESCRIPTION OF A PREFERRED EMBODIMENT

The method will now be described with reference to an embodiment example, namely the testing of semiconductor components during the manufacturing process. In the course of the manufacturing process of the semiconductor components, for example, a test operation takes place over several successively performed measurement operations on the semiconductor components on the semiconductor wafer in a test mode as so-called "samples" and a test operation takes place over several successively performed measurement operations to be carried out on the finally assembled and mounted semiconductor component in a test mode as so-called "final measurement".

In both test modes, each test operation here within the test sequence allocated as a measurement mode is either a total measurement mode with the complete quantity of measurement operations, or a partial measurement mode with a reduced quantity of measurement operations. The quantity of measurement operations of the partial measurement mode and the order of both the measurement modes in the test sequence are specified differently in the two test modes named above: In the "samples" test mode, minimization of the costs due to testing is aimed for, whereas in the "final measurement" test mode the maintenance of a guaranteed maximum reject rate is aimed for (minimum defect frequency).

For both test modes, a specific order is specified for the measurement modes according to the number of test operations and the distribution of the products with negative test result (defective products) within the test sequence:

The total measurement mode is allocated to the two first test operations in a test sequence and then to every fourth test operation. One thus has a test sequence comprising 2×total measurement mode, 3×partial measurement mode, 1×total measurement mode, 3×partial measurement mode etc.

When a product is encountered with a negative test result (defective product), the test sequence commences at the beginning, i.e., the total measurement mode is allocated to the next two test operations (2×total measurement mode). Consequently, when several defective products are encountered in sequence, after one of these defective products has been detected a test operation is performed with all measurement operations on all following products also. Then products will then certainly be identified as being defective, i.e., in areas with low yield, all products are verified completely.

After two successive test operations have provided a positive test result (two fault-free products in sequence), the normal test sequence of 3×partial measurement mode, 1×total measurement mode, 3×partial measurement mode etc. is again applied.

The results for the two test modes "samples" and "final measurement" will now be described with reference to the example of an integrated circuit (IC) for the motor vehicle industry, an analog/digital IC for dimmer applications.

In the manufacturing process of the integrated circuits (ICs) (manufacturing costs approx. 0.79 DM per IC) the semiconductor elements arranged on a 4" silicon wafer (for example, 840 semiconductor elements measuring 3.54 mm×2.07 mm) are processed by means of a standard bipolar technology and the processed semiconductor elements are provided with a DIP housing with 8 terminals. In the course of the manufacturing process, two test modes are performed with three test operations: one test operation on the semiconductor elements of a wafer (test mode "samples"), for example with 40 successively performed measurement operations at a temperature of 25° C., and two test operations on the finally assembled semiconductor elements (test mode "final measurement"), for example a test operation with 37 successively performed measurement operations at a temperature of 110° C. and a test operation with 36 successively performed measurement operations at a temperature of −40° C. The measurement time here per fault-free test operation, i.e., when all measurement operations are performed, is approx. 1.2 s.

In the test mode "samples", the order of the measurement operations was changed in accordance with the invention and in addition to the total measurement mode a partial measurement mode with only 5 measurement operations was applied. In the Figure, the measurement times $t_M$ (and thus the costs) are plotted against the yield (percentage proportion of defective products) in the function test with a conventional method (curve a) and with the method described here (curve b). As this comparison shows, there is a considerable reduction of the measurement time $t_M$ for the method described here (curve b) and the test operation in zones with low yield (many defective products) is completed in a shorter time because of the selected order of the measurement operations and in zones with high yield (few defective products) because of the small amount of measurement operations performed (allocation of many partial measurement modes). The costs saved by reducing the measurement time $t_M$ are in total approx. 0.03 DM per IC, i.e. for a total manufacturing cost of approx. 0.79 DM per IC this results in a reduction of the manufacturing costs of approx. 4%.

In the test mode "final measurement", a maximum reject rate of 200 ppm was specified (i.e. a maximum of 200 defective semiconductor components per 1 million tested semiconductor components) with a reliability of 95%, and the order of the measurement operations was varied in accordance with the invention and, in addition to the total measurement mode with all 36 or 37 successively performed measurement operations, a partial measurement mode was applied with 31 measurement operations. The cost saving due to the reduction of the measurement time by approx. 80 ms per IC amounts to 0.0032 DM per IC, with the probability of discovering defective ICs being 99.89% and the reject rate 33 ppm.

What is claimed is:

1. Method of testing a large number of products in which every product to be tested is subjected to at least one test mode that is carried out in a test sequence successively on all products by means of a test operation comprising several successively performed measurement operations, where statistical information on the test operation of products already tested is allowed for and where a test result is allocated for every product tested, wherein:

in each test mode the order of the measurement operations of a test operation is specified such that the measurement operations are arranged under consideration of their error frequency per measurement time and the functional dependencies between the measurements operations;

each test operation within the test sequence of a test mode is allocated a measurement mode which has a certain quantity of measurement operations to be performed and which is specified in accordance with the quantity and the test results of the products already tested in a test sequence; and either a total measurement mode, in which all measurement operations of a test operation are performed, or a partial measurement mode, in which a subset of the measurement operations of a test operation is performed, is allocated as measurement mode to each test operation within the test sequence of a test mode; and the total and partial measurement modes normally alternate within a test operation according to a given sequence.

2. Method in accordance with claim 1, wherein in each test mode the measurement operations of a test operation are arranged in terms of time under consideration of the functional dependencies between the measurement operations in accordance with their fault frequency per measurement time, such that measurement operations with high fault frequency per measurement time are carried out at the commencement of the test operation.

3. Method in accordance with claim 1, wherein in the partial measurement mode the subset of the measurement operations of a test operation is established according to the costs affected by the test operation and/or the guaranteed maximum error frequency of the test mode.

4. Method in accordance with claim 1, wherein a certain quantity of test operations at the beginning of the test sequence of a test mode and a certain number of test operations following a product with a negative test result is allocated to the total measurement mode.

5. Method in accordance with claim 4, wherein the first two test operations of the test sequence of a test mode and the two test operations following a product with negative test result are allocated to the total measurement mode.

6. Method in accordance with claim 1, wherein the test operation following a certain quantity of products with positive test result is allocated to the total measurement mode.

7. Method in accordance with claim 6, wherein the test operation following three products with positive test result is allocated to the total measurement mode.

8. Method according to claim 1 wherein the sequence initially includes at least two total measurement modes followed by a repeating sequence of a greater number of partial measurement modes, a single total measurement mode, and the greater number of partial measurement modes.

9. Method according to claim 8 further including switching to the total measurement mode following detection of a first predetermined number of products with a negative test result.

10. Method according to claim 9, including switching to the repeating sequence following a second predetermined number of positive test results in the total measurement mode.

11. Method according to claim 10 wherein said first predetermined number is 1.

12. Method according to claim 10 wherein said second predetermined number is 2.

13. Method of testing a large number of products in which every product to be tested is subjected to at least one test mode that is carried out in a test sequence successively on all products by means of a test operation comprising several successfully performed measurement operations, where statistical information on the test operation of products already tested is allowed for and where a test result is allocated for every product tested wherein:

in each test mode the order of the measurement operations of a test operation is specified in such a way that the measurement operations are arranged under consideration of their error frequency per measurement time and the functional dependencies between the measurement operations;

each test operation within the test sequence of a test mode is allocated a measurement mode which has a certain quantity of measurement operations to be pg,16 performed and which is specified in accordance with the quantity and the test results of the products already tested in a test sequence;

either a total measurement mode, in which all measurement operations of a test operation are performed, or a partial measurement mode, in which a subset of the measurement operations of a test operation is performed, is allocated as measurement mode to each test operation, within the test sequence of a test mode; and the test operation following a certain quantity of products with positive test result is allocated to the total measurement mode.

14. Method in accordance with claim 13, wherein the test operation following three products with positive test result is allocated to the total measurement mode.

* * * * *